(12) United States Patent
Takezawa

(10) Patent No.: US 12,071,714 B2
(45) Date of Patent: Aug. 27, 2024

(54) ANISOTROPIC THERMAL CONDUCTIVE RESIN FIBER, ANISOTROPIC THERMAL CONDUCTIVE RESIN MEMBER, AND MANUFACTURING METHOD OF THESE

(71) Applicant: HITACHI CHEMICAL COMPANY, LTD., Tokyo (JP)

(72) Inventor: Yoshitaka Takezawa, Tokyo (JP)

(73) Assignee: RESONAC CORPORATION, Tokyo (JP)

( * ) Notice: Subject to any disclaimer, the term of this patent is extended or adjusted under 35 U.S.C. 154(b) by 821 days.

(21) Appl. No.: 16/976,764

(22) PCT Filed: Feb. 27, 2019

(86) PCT No.: PCT/JP2019/007584
§ 371 (c)(1),
(2) Date: Aug. 31, 2020

(87) PCT Pub. No.: WO2019/168037
PCT Pub. Date: Sep. 6, 2019

(65) Prior Publication Data
US 2020/0407888 A1    Dec. 31, 2020

(30) Foreign Application Priority Data
Mar. 1, 2018    (JP) .................................. 2018-036780

(51) Int. Cl.
*D02G 3/36* (2006.01)
*D01D 10/00* (2006.01)
*D06M 15/00* (2006.01)
*H01L 23/36* (2006.01)

(52) U.S. Cl.
CPC ............. *D02G 3/36* (2013.01); *D01D 10/00* (2013.01); *D06M 15/00* (2013.01); *H01L 23/36* (2013.01)

(58) Field of Classification Search
CPC ......... D02G 3/36; D01D 10/00; D06M 15/00; H01L 23/36
See application file for complete search history.

(56) References Cited

U.S. PATENT DOCUMENTS 3,091,019 A * 5/1963 Wetterau .................. D02G 3/36
                                                                                  428/401
3,889,038 A * 6/1975 Wiczer ..................... D02G 3/36
                                                                                  427/373
(Continued)

FOREIGN PATENT DOCUMENTS

| CN | 103687923 | 3/2014 |
| CN | 106498538 | 3/2017 |

(Continued)

OTHER PUBLICATIONS

Arden L. Moore et al., "Emerging challenges and materials for thermal management of electronics", Materials Today, vol. 17, May 2014, pp. 163-174.

(Continued)

*Primary Examiner* — Shaun R Hurley
(74) *Attorney, Agent, or Firm* — JCIPRNET

(57) ABSTRACT

An aspect of the present invention is an anisotropic thermal conductive resin fiber including a stretch fiber of a thermoplastic resin; and a thermal insulation material covering the stretch fiber.

12 Claims, 5 Drawing Sheets

(56) References Cited

U.S. PATENT DOCUMENTS

| | | | | |
|---|---|---|---|---|
| 4,107,135 | A * | 8/1978 | Duggins | C08L 57/00 523/451 |
| 4,420,534 | A | 12/1983 | Matsui et al. | |
| 5,390,734 | A | 2/1995 | Voorhes et al. | |
| 5,542,471 | A | 8/1996 | Dickinson | |
| 6,286,591 | B1 | 9/2001 | Bonneville | |
| 11,814,568 | B2 * | 11/2023 | Takezawa | C09K 5/14 |
| 2003/0056943 | A1 | 3/2003 | Dessiatoun et al. | |
| 2003/0167548 | A1 * | 9/2003 | LaShoto | A41D 13/015 2/22 |
| 2005/0101719 | A1 * | 5/2005 | Ishihara | C08K 3/013 524/495 |
| 2005/0231983 | A1 | 10/2005 | Dahm | |
| 2008/0311811 | A1 * | 12/2008 | Douglas | D03D 15/267 442/184 |
| 2010/0009585 | A1 * | 1/2010 | Jennings | G03G 15/754 428/221 |
| 2012/0067548 | A1 * | 3/2012 | Tun | F28F 21/062 264/129 |
| 2014/0210068 | A1 | 7/2014 | Bartley et al. | |
| 2014/0367078 | A1 | 12/2014 | Bürger et al. | |
| 2016/0141260 | A1 | 5/2016 | Chang et al. | |
| 2017/0030012 | A1 * | 2/2017 | Bathelier | B32B 27/12 |
| 2017/0037614 | A1 * | 2/2017 | Hoffman | E04C 2/284 |
| 2018/0044561 | A1 | 2/2018 | Goletto | |
| 2019/0110935 | A1 | 4/2019 | Rosati | |
| 2019/0378495 | A1 | 12/2019 | Kim et al. | |
| 2020/0407617 | A1 * | 12/2020 | Takezawa | D01D 10/00 |

FOREIGN PATENT DOCUMENTS

| | | |
|---|---|---|
| CN | 107000376 | 8/2017 |
| JP | H06214067 | 8/1994 |
| JP | 2000068429 | 3/2000 |
| JP | 2000151164 | 5/2000 |
| JP | 2000273196 | 10/2000 |
| JP | 2001168248 | 6/2001 |
| JP | 2002088171 | 3/2002 |
| JP | 2002093969 | 3/2002 |
| JP | 2004225170 | 8/2004 |
| JP | 2004285522 | 10/2004 |
| JP | 2014522109 | 8/2014 |
| JP | 2017087446 | 5/2017 |
| KR | 20150130598 | 11/2015 |
| WO | 2011048824 | 4/2011 |
| WO | 2011101464 | 8/2011 |
| WO | 2015178416 | 11/2015 |
| WO | 2015190930 | 12/2015 |
| WO | 2017078888 | 5/2017 |
| WO | 2017141682 | 8/2017 |

OTHER PUBLICATIONS

Susmita Dash et al., "Photothermal trap utilizing solar illumination for ice mitigation", Science Advances, vol. 4, Aug. 2018, pp. 1-7.
Congliang Huang et al., "Thermal Conductivity of Polymers and Polymer Nanocomposites", Materials Science & Enginering, Jun. 2018, pp. 1-22.

* cited by examiner

ANISOTROPIC THERMAL CONDUCTIVE RESIN FIBER, ANISOTROPIC THERMAL CONDUCTIVE RESIN MEMBER, AND MANUFACTURING METHOD OF THESE

CROSS-REFERENCE TO RELATED APPLICATION

This application is a 371 application of the international PCT application serial no. PCT/JP2019/007584, filed on Feb. 27, 2019, which claims the priority benefit of Japan application no. 2018-036780, filed on Mar. 1, 2018. The entirety of each of the above—mentioned patent applications is hereby incorporated by reference herein and made a part of this specification.

TECHNICAL FIELD

The present invention relates to an anisotropic thermal conductive resin fiber, an anisotropic thermal conductive resin member and a manufacturing method of these.

BACKGROUND ART

As electronic components have become highly integrated, smaller, and thinner, in recent years, more heat generated from the electronic components accumulates in electronic devices, and thus reliability problems such as malfunctions of electronic devices and shortening of the lifespan are likely to occur. Therefore, it is important to efficiently dissipate heat generated from the electronic components to the outside.

In order to address such problems, a resin member having excellent thermal conductivity and electrical insulation is provided between an electronic component and a heatsink. Regarding such a sheet, for example, in Patent Literature 1, a thermal conductive sheet which includes a thermal conductive filler, fibers and a resin and in which the fibers are entangled in a plane shape, the entangled fibers support the thermal conductive filler to form a base sheet, and the resin is filled into the base sheet is disclosed.

CITATION LIST

Patent Literature

[Patent Literature 1]
Japanese Patent Laid-Open No. 2017-87446

SUMMARY

Technical Problem

However, since heat is isotropically conducted without directivity, when the thermal conductive sheet described in Patent Literature 1 is used, heat is conducted not only in a direction in which heat should be conducted (direction from the electronic component to the heatsink), but also, for example, in a direction of other electronic components in the electronic device. In this case, there is a risk of the reliability of the electronic device being impaired when an electronic component weak with respect to heat is exposed to heat. However, since it is difficult for the resin to have a regular structure such as a crystalline structure, it is difficult to freely impart anisotropy (directivity) for thermal conductivity in the resin member.

Here, an objective of the present invention is to provide a resin fiber and a resin member which can anisotropically conduct heat and a manufacturing method of these.

Solution to Problem

An aspect of the present invention is an anisotropic thermal conductive resin fiber including a stretch fiber of a thermoplastic resin; and a thermal insulation material covering the stretch fiber.

Another aspect of the present invention is an anisotropic thermal conductive resin member, including: a plurality of resin fibers which are bundled, wherein the resin fibers include a stretch fiber of a thermoplastic resin and a thermal insulation material covering the stretch fiber.

In the resin fiber and the resin member, since the stretch fibers are fibers having high orientation, even if they are formed of a thermoplastic resin having low crystallinity, they have a pseudo crystalline structure, and easily confine phonons in the stretch fibers. Nevertheless, in order to reduce radiant heat leaking from around the stretch fibers, in the resin fiber and the resin member, the stretch fibers are covered with the thermal insulation material. Thereby, in the resin fiber and the resin member, heat is conducted with anisotropy (directivity) in the extension direction of the resin fibers. In addition, in this resin member, since the plurality of resin fibers are bundled, the cross-sectional area of the heat conduction path (stretch fibers) is larger, and thus heat can be conducted with high efficiency.

The resin member may include a first region and a second region each including a plurality of resin fibers, and the plurality of resin fibers in the first region and the plurality of resin fibers in the second region may extend in directions that are different from each other. In this case, heat can be anisotropically conducted in two directions: the extension direction of the resin fibers in the first region and the extension direction of the resin fibers in the second region.

The plurality of resin fibers in the first region and the plurality of resin fibers in the second region may extend in directions that are substantially orthogonal to each other. In this case, heat can be anisotropically conducted in two directions that are substantially orthogonal to each other.

The resin member may include a first region, a second region and a third region each including a plurality of resin fibers, and the plurality of resin fibers in the first region, the plurality of resin fibers in the second region, and the plurality of resin fibers in the third region may extend in directions that are different from each other. In this case, heat can be anisotropically conducted in three directions: the extension direction of the resin fibers in the first region, the extension direction of the resin fibers in the second region, and the extension direction of the resin fibers in the third region.

The plurality of resin fibers in the first region, the plurality of resin fibers in the second region, and the plurality of resin fibers in the third region may extend in directions that are substantially orthogonal to each other. In this case, heat can be anisotropically conducted in three directions that are substantially orthogonal to each other.

Another aspect of the present invention is a method of manufacturing an anisotropic thermal conductive resin fiber, including: a step of producing a stretch fiber by stretching a thermoplastic resin; and a step of covering the stretch fiber with a thermal insulation material.

Another aspect of the present invention is a method of manufacturing an anisotropic thermal conductive resin member, including: a step of producing stretch fibers by stretching a thermoplastic resin; a step of producing resin fibers by covering the stretch fibers with a thermal insulation material; and a step of bundling the plurality of resin fibers.

In these manufacturing methods, since fibers having high orientation are produced by stretching, even if they are formed of a thermoplastic resin having low crystallinity, they have a pseudo crystalline structure, and stretch fibers that easily confine phonons in fibers are obtained. Nevertheless, in order to reduce radiant heat leaking from around the stretch fibers, in these manufacturing methods, the stretch fibers are covered with a thermal insulation material. Thereby, in these manufacturing methods, the resin fibers and the resin member which conduct heat with anisotropy (directivity) in the extension direction of the resin fibers are obtained. In addition, in the method of manufacturing a resin member, the cross-sectional area of the heat conduction path (stretch fibers) is increased by bundling the plurality of resin fibers, and thus a resin member capable of conducting heat with high efficiency is obtained.

Advantageous Effects of Invention

According to the present invention, it is possible to provide a resin fiber and a resin member which can anisotropically conduct heat and a manufacturing method of these.

DESCRIPTION OF EMBODIMENTS

Embodiments of the present invention will be appropriately described below in detail with reference to the drawings.

Figure 1:
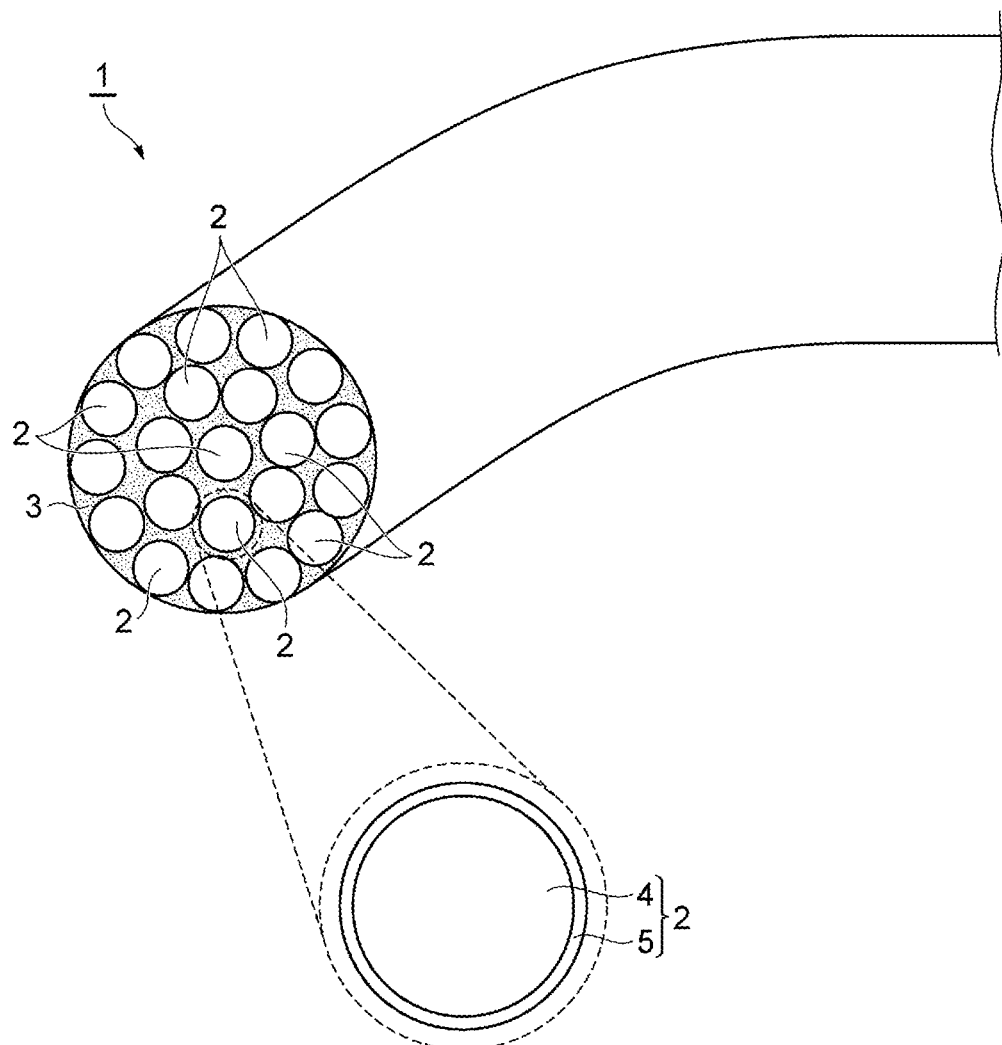
FIG. 1 is a perspective view showing a resin member according to one embodiment.

FIG. 1 is a perspective view showing a resin member according to one embodiment. As shown in FIG. 1, a resin member 1 includes a plurality of bundled resin fibers (also called fiber strands) 2, and is formed into a fiber form.

For example, the plurality of resin fibers 2 are aggregated (bundled) by a binder 3 that binds the resin fibers 2 so that they extend in substantially the same direction. When viewed in a cross section, the plurality of resin fibers 2 may be regularly arranged or irregularly arranged.

The binder 3 is not particularly limited, and may be made of, for example, polyurethane, an acrylic polymer, an epoxy resin or the like, and is preferably made of a material having a heat insulating property such as aerogel and nano bubbles.

In one embodiment, the binder 3 is made of a material that can be cured without relaxing a stretched and oriented state of the resin fibers 2. For example, the binder 3 is specifically made of a material that can be cured at a temperature equal to or lower than a stretching temperature of the resin fibers 2. In one embodiment, the binder 3 is obtained by curing a material having a viscosity characteristic in which it can impregnate gaps between the resin fibers 2 during heating and curing.

As shown in FIG. 1, each of the resin fibers 2 includes stretch fibers 4, and thermal insulation materials 5 covering the stretch fibers 4. For example, as shown in FIG. 1, the cross-sectional shape of the resin fibers 2 may be a substantially perfect circle, or may be a regular shape such as an elliptical shape or a polygonal shape, or may be an irregular shape.

The stretch fibers 4 are fibers obtained by stretching a thermoplastic resin. Examples of thermoplastic resins include an acrylic polymer, a methacrylic polymer, polyamide, polyethylene terephthalate, polyarylate, polysulfone, and polyether ether ketone.

In consideration of both ease of phonon confinement and ease of phonon incidence, the diameter (maximum diameter) of the stretch fiber 4 is preferably 0.1 µm or more, more preferably 10 µm or more, and still more preferably 100 µm or more. In consideration of handling properties when bundling, the diameter (maximum diameter) of the stretch fiber 4 is preferably 1,000 µm or less, more preferably 500 µm or less, and still more preferably 200 µm or less.

The thermal insulation material 5 may be, for example, aerogel or nano bubbles. In order to further reduce leakage of radiant heat to the outside of the resin fibers 2, the thermal conductivity of the thermal insulation material 5 is, for example, 0.1 W/(m·K) or less. In order to further reduce leakage of radiant heat to the outside of the resin fibers 2, for example, the thermal insulation material 5 covers 50% or more of the surface area of the stretch fibers 4, and preferably covers substantially the entire surface of the stretch fibers 4. The thickness of the thermal insulation material 5 is not particularly limited, and may be, for example, 0.05 µm or more or 500 µm or less.

In the resin member 1, since the stretch fibers 4 are fibers having high orientation, even if they are formed of a thermoplastic resin having low crystallinity, they have a pseudo crystalline structure, and easily confine phonons in the stretch fibers 4. Nevertheless, in order to reduce radiant heat leaking from around the stretch fibers 4, in the resin member 1, the stretch fibers 4 are covered with the thermal insulation materials 5. Thereby, in the resin member 1, heat is conducted with anisotropy (directivity) in the extension direction of the resin fibers 2. Specifically, thermal conductivity of the resin fibers 2 in the longitudinal direction/ thermal conductivity of the resin fibers 2 in the lateral direction is, for example, 5,000/1 to 100/1. That is, the resin fibers 2 and the resin member 1 have anisotropic thermal conductivity in which heat can be anisotropically conducted in one extension direction of the resin fibers 2. In addition, in the resin member 1, when the plurality of resin fibers 2 are bundled, the cross-sectional area of the heat conduction path (the stretch fibers 4) is larger, and thus heat can be conducted with high efficiency.

Such a resin member 1 is suitably used as, for example, a heat transfer member that thermally connects a heating element to a heat reservoir. Specifically, for example, when one end side of the resin member 1 is thermally connected to the heating element and the other end side is thermally connected to the heating element, the resin member 1 can reduce dissipation of heat to the outside in the transfer procedure, and thus heat generated in the heating element can be efficiently transferred to the heat reservoir.

Figure 2:
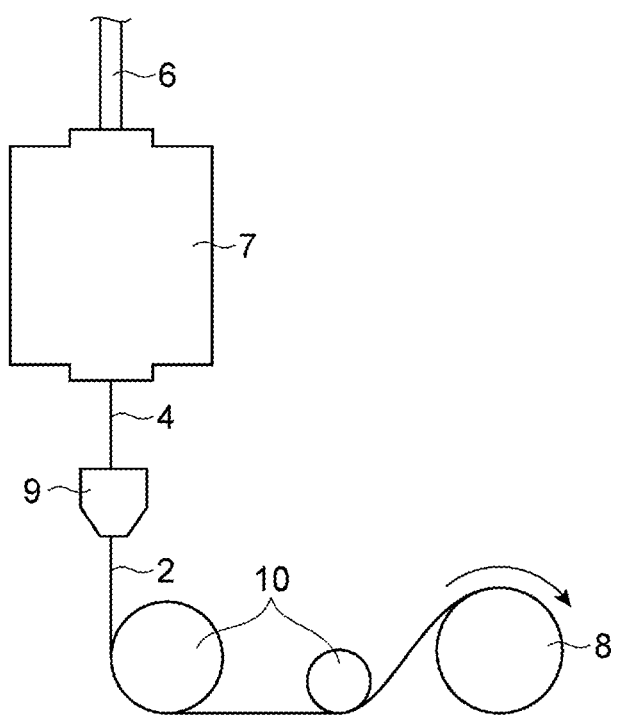
FIG. 2 is a schematic view illustrating a method of manufacturing a resin fiber according to one embodiment.

Next, methods of manufacturing the resin fibers 2 and the resin member 1 will be described. FIG. 2 is a schematic view illustrating a method of manufacturing a resin fiber according to one embodiment. As shown in FIG. 2, the method of manufacturing a resin fiber includes a resin fiber producing step.

In the resin fiber producing step, first, a thermoplastic resin is stretched to produce stretch fibers (stretch fiber producing step). In the stretch fiber producing step, as shown in FIG. 2, a thermoplastic resin 6 is heated in a heating furnace 7 and is stretched in a winding direction (pulling direction) by being wound (pulled) by a winding part 8. Specifically, first, for example, the thermoplastic resin 6 molded into a rod having a diameter of 5 to 50 mm is put into the heating furnace 7. The thermoplastic resin 6 is heated in the heating furnace 7 and stretched by being wound (pulled) by the winding part 8 installed at the tip of the heating furnace 7.

The temperature of the heating furnace 7 is appropriately set according to the softening temperature of the thermoplastic resin 6, and in order to suitably impart orientation when the thermoplastic resin 6 is stretched, preferably, the temperature is equal to or higher than a thermal distortion temperature of the thermoplastic resin and lower than the melting point. The thermoplastic resin 6 is stretched, for example, under conditions in which the stretch ratio is 10 to 1,000.

The stretch fibers 4 thus ejected from the heating furnace 7 in this manner are formed into a fine wire having a diameter smaller than the diameter of the thermoplastic resin 6 (the diameter of the rod) before they are put into the heating furnace 7. Next, as shown in FIG. 2, the stretch fibers 4 are put into a thermal insulation material supply unit 9, and covered with the thermal insulation materials 5 (thermal insulation material covering step). In the thermal insulation material supply unit 9, for example, the thermal insulation materials 5 are heated and supplied in a molten state, and the stretch fibers 4 are immersed in the molten thermal insulation materials 5 (dip coating), and thus the surfaces of the stretch fibers 4 are covered with the thermal insulation materials 5.

Thereby, the resin fibers 2 including the stretch fibers 4 and the thermal insulation materials 5 covering the stretch fibers 4 are obtained. The resin fibers 2 are wound around the winding part 8 along a roller 10 that is appropriately provided between the thermal insulation material supply unit 9 and the winding part 8.

The method of manufacturing the resin member 1 includes the above resin fiber producing step and a bundling step in which the plurality of resin fibers 2 are bundled. In the bundling step following the resin fiber producing step, a plurality of resin fibers 2 are prepared, and the plurality of resin fibers 2 are bundled using the binder 3. The bundling method may be a known method. Thereby, the resin member 1 is obtained.

In the method of manufacturing a resin member, a step of processing the resin member 1 into a desired shape may be additionally performed after the bundling step. The processing in this step may be, for example, slice processing in which the resin member 1 is cut in a direction perpendicular to the extension direction of the resin fibers 2. In order to reduce loss of thermal conductivity anisotropy of the resin fibers 2, the slice processing is preferably performed at a glass transition temperature of the thermoplastic resin constituting the stretch fibers 4 or lower.

In the methods of manufacturing the resin fibers 2 and the resin member 1 described above, when the stretch fibers 4 having high orientation are produced by stretching, even if they are formed of a thermoplastic resin having low crystallinity, they have a pseudo crystalline structure, and the stretch fibers 4 that easily confine phonons in fibers are obtained. Nevertheless, in order to reduce radiant heat leaking from around the stretch fibers 4, in this manufacturing method, the stretch fibers 4 are covered with the thermal insulation materials 5. Thereby, the resin fibers 2 and the resin member 1 which conduct heat with anisotropy (directivity) in the extension direction of the resin fibers 2 are obtained. In addition, in the method of manufacturing the resin member 1, when the plurality of resin fibers 2 are bundled, the cross-sectional area of the heat conduction path (the stretch fibers 4) is larger, and thus the resin member 1 that can conduct heat with high efficiency is obtained.

In the above embodiment, one resin fiber 2 includes one stretch fiber 4 and the thermal insulation materials 5 covering the one stretch fiber 4. However, in another embodiment, one resin fiber may include a plurality of stretch fibers and a thermal insulation material that covers all of the plurality of stretch fibers. As in the above embodiment, the resin fibers according to this embodiment also have anisotropic thermal conductivity in which heat can be anisotropically conducted in one extension direction of the resin fibers.

Figure 3:
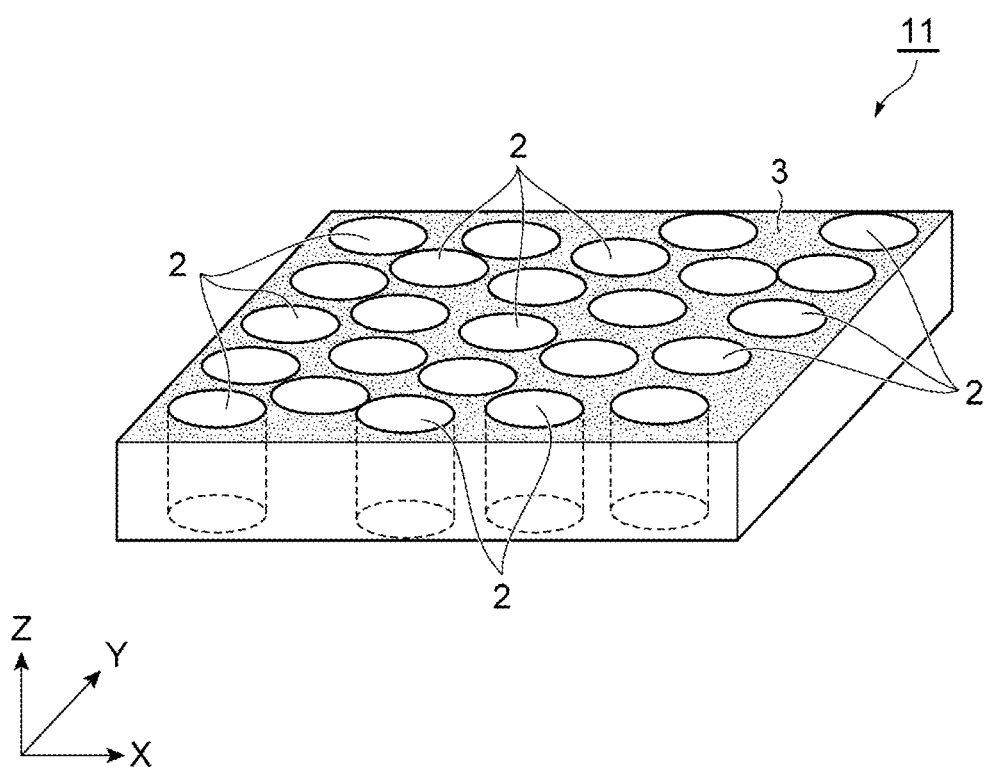
FIG. 3 is a perspective view showing a resin member according to another embodiment.

In addition to the above embodiment, a resin member according to another embodiment can be obtained. FIG. 3 is a perspective view showing a resin member according to another embodiment. As shown in FIG. 3, a resin member 11 according to another embodiment includes a plurality of resin fibers 2 and is formed in a sheet shape. In the resin member 11, the plurality of resin fibers 2 are bundled via a binder 3 so that they extend in substantially the same direction (thickness direction (Z direction) of the resin member 11).

In the resin member 11, heat that has entered each of the resin fibers 2 from one surface (X-Y plane) of the resin member 11 is conducted in the extension direction (Z direction) of the resin fibers 2, but diffuses in other directions and unlikely to dissipate to the outside of the resin fibers 2. In this manner, the resin member 11 has anisotropic thermal conductivity in which heat can be anisotropically conducted in one extension direction (the thickness direction of the sheet-like resin member 11) of the resin fibers 2.

Such a resin member 11 is suitably used as a member (thermal conductive sheet) that is provided between an electronic component that is a heat source and a heatsink in an electronic device. The resin member 11 can conduct heat generated from the electronic component only in a direction in which heat should be conducted (direction toward the heatsink), and thus can reduce conduction of heat in a direction in which other electronic components (in particular, electronic components weak with respect to heat) are arranged in the electronic device. Therefore, the resin member 11 can reduce deterioration of reliability of the electronic device due to heat.

In addition, such a resin member 11 is suitably used as a thermal switch. Specifically, for example, the resin member 11 is provided on the roof of a vehicle. Thus, when radiant heat from the sun is desired to be taken into the vehicle, the surface (X-Y plane) perpendicular to the extension direction of the resin fibers 2 of the resin member 11 is arranged to face the sun. Thereby, radiant heat enters each of the resin fibers 2, and is efficiently conducted in one extension direction of the resin fibers 2 and is suitably taken into the vehicle. On the other hand, when it is desired to block radiant heat from the sun, the surface (X-Z plane or Y-Z plane) parallel to the extension direction of the resin fibers 2 of the resin member 11 is arranged to face the sun. Thereby, the radiant heat does not enter the resin fibers 2 and is blocked by the resin member 11.

For example, the resin member 11 is obtained by performing cutting at a desired thickness in a direction perpendicular to the extension direction of the resin fibers 2 after the above bundling step in the manufacturing method.

Figure 4:
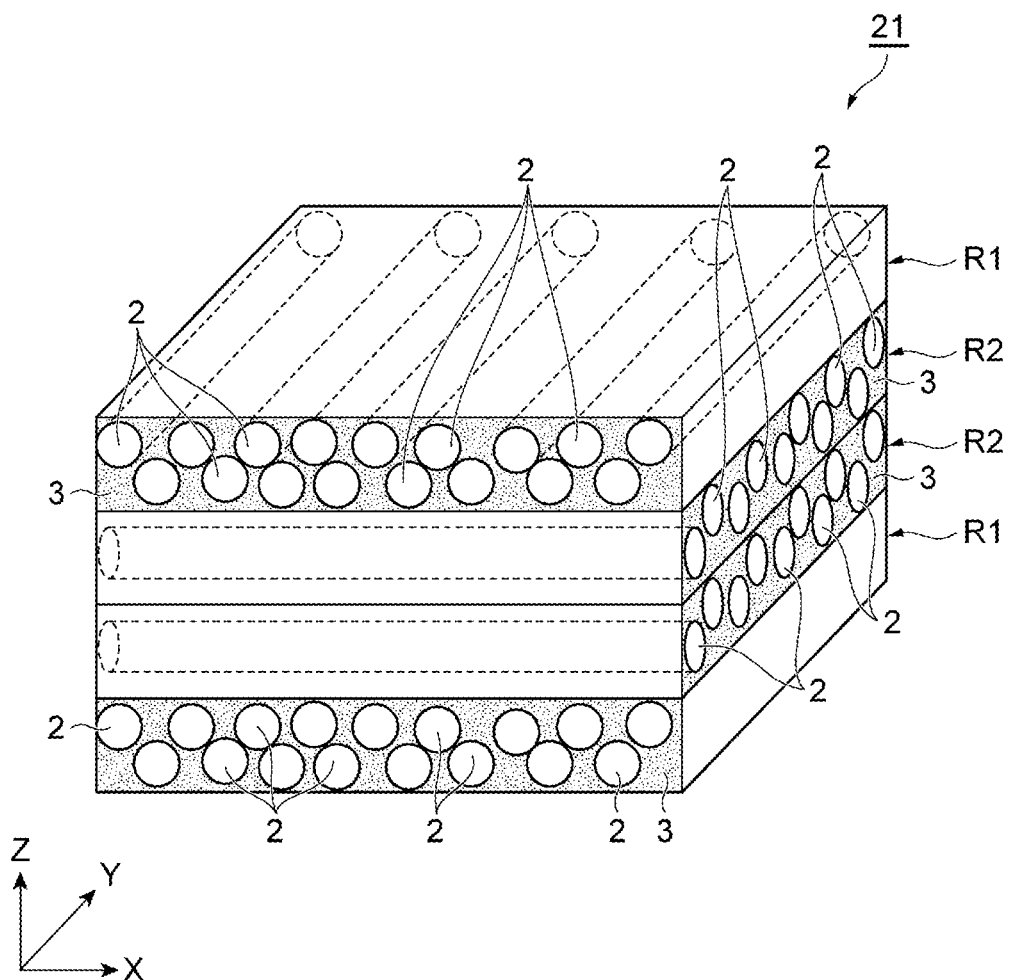
FIG. 4 is a perspective view showing a resin member according to another embodiment.

FIG. 4 is a perspective view showing a resin member according to another embodiment. As shown in FIG. 4, a resin member 21 according to another embodiment may include a plurality of regions each formed in a sheet shape. Each of the regions includes a plurality of bundled resin fibers 2 and a binder 3 that binds the resin fibers 2.

More specifically, the resin member 21 includes a first region R1 including a plurality of resin fibers 2 and a second region R2 including a plurality of resin fibers 2, and the plurality of resin fibers 2 in the first region R1 and the plurality of resin fibers 2 in the second region R2 extend in directions that are substantially orthogonal to each other. In the resin member 21, for example, as shown in FIG. 4, the first region R1, the second region R2, the second region R2, and the first region R1 may be laminated in this order. In the resin member 21, all of the plurality of resin fibers 2 in the first region R1 and the plurality of resin fibers 2 in the second region R2 may extend along a plane (X-Y plane) perpendicular to the lamination direction (Z direction) of the regions.

In the resin member 21, the plurality of resin fibers 2 are bundled via the binder 3 so that they extend in different directions (the X direction and the Y direction) in the first region R1 and the second region R2. Therefore, heat that has entered each of the resin fibers 2 from the surface (X-Z plane) perpendicular to the extension direction of the resin fibers 2 in the first region R1 of the resin member 21 is conducted in the extension direction of the resin fibers 2 in the first region R1, but diffuses in other directions and is unlikely to dissipate to the outside of the resin fibers 2. Similarly, heat that has entered each of the resin fibers 2 from the surface (Y-Z plane) perpendicular to the extension direction of the resin fibers 2 in the second region R2 of the resin member 21 is conducted in the extension direction of the resin fibers 2 in the second region R2, but diffuses in other directions and is unlikely to dissipate to the outside of the resin fibers 2.

In this manner, the resin member 21 has anisotropic thermal conductivity in which heat can be anisotropically conducted in two directions: the extension direction of the resin fibers 2 in the first region R1 and the extension direction of the resin fibers 2 in the second region R2.

Figure 5:
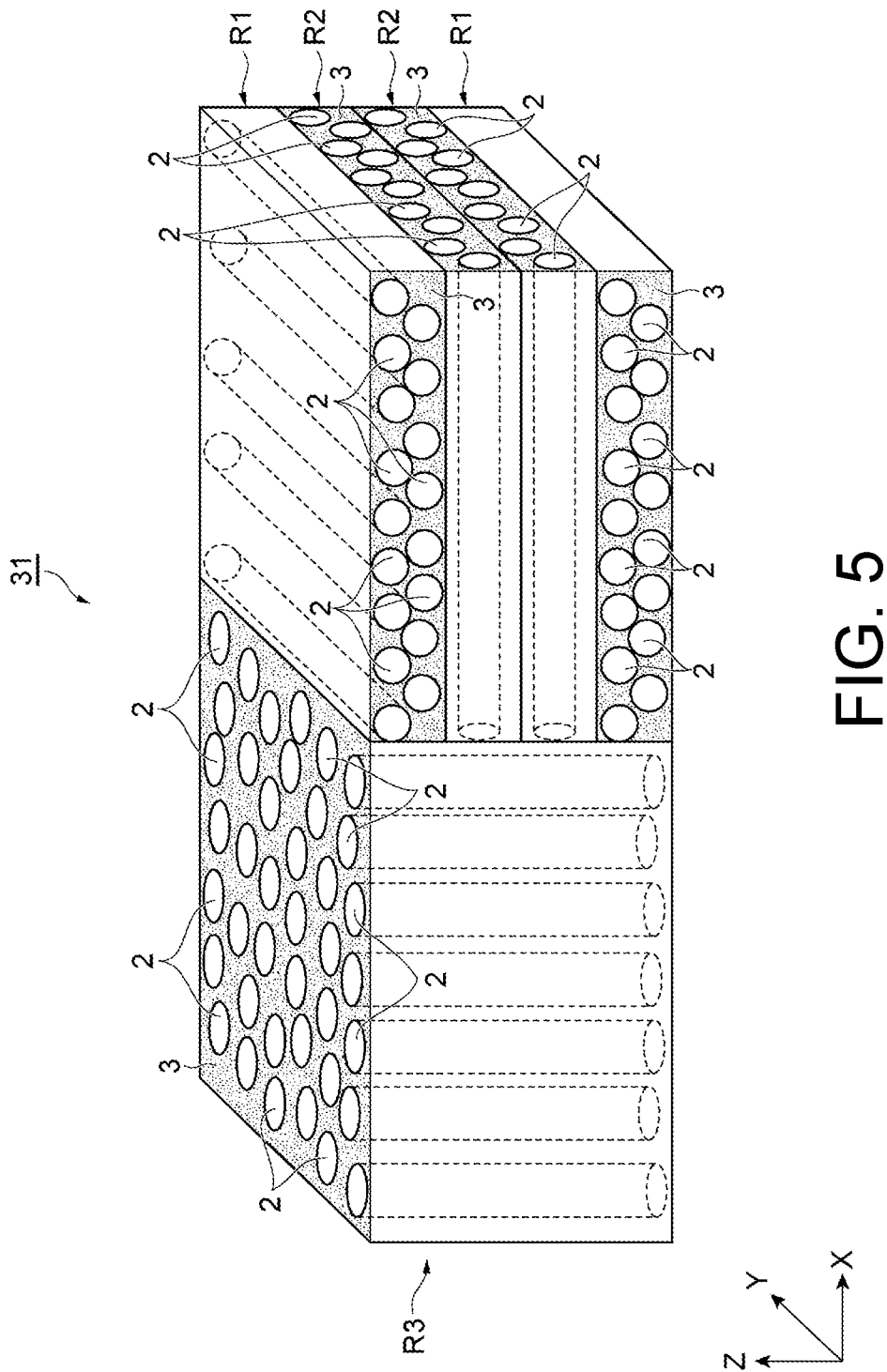
FIG. 5 is a perspective view showing a resin member according to another embodiment.

FIG. 5 is a perspective view showing a resin member according to another embodiment. As shown in FIG. 5, a resin member 31 according to another embodiment may additionally include a third region R3 in addition to the first region R1 and the second region R2 in the resin member 21 shown in FIG. 4. The third region also includes a plurality of bundled resin fibers 2 and a binder 3 that binds the resin fibers 2.

The plurality of resin fibers 2 in the third region R3 extend in the direction (Z direction) substantially orthogonal to those of the plurality of resin fibers 2 in the first region R1 and the plurality of resin fibers 2 in the second region R2.

In the resin member 31, the plurality of resin fibers 2 are bundled via the binder 3 so that they extend in directions (the X direction, the Y direction and the Z direction) different from each other in the first region R1, the second region R2 and the third region R3. Therefore, in addition to the first region R1 and the second region R2, also in the third region R3, heat that has entered each of the resin fibers 2 from the surface (X-Y plane) perpendicular to the extension direction of the resin fibers 2 is conducted in the extension direction of the resin fibers 2 in the third region R3, but diffuses in other directions and is unlikely to dissipate to the outside of the resin fibers 2.

In this manner, the resin member 31 has anisotropic thermal conductivity in which heat can be anisotropically conducted in three directions: the extension direction of the resin fibers 2 in the first region R1, the extension direction of the resin fibers 2 in the second region R2, and the extension direction of the resin fibers 2 in the third region R3.

The resin member may have an embodiment other than the embodiment described above. For example, the resin member may have a shape other than the fiber shape and the sheet shape.

In the resin member 11 shown in FIG. 3, each of the resin fibers 2 extends in the thickness direction of the resin member 11, but each of the resin fibers may extend in the direction (the X direction or the Y direction) along the main surface (X-Y plane) of the resin member.

In the resin members 21 and 31 shown in FIGS. 4 and 5, the resin fibers 2 in the plurality of regions R1, R2, and R3 extend in directions that are substantially orthogonal to each other, but the resin fibers in the plurality of regions only need to extend in directions that are different from each other, and may extend in any direction depending on the anisotropy of the desired thermal conductivity.

The resin members 21 and 31 shown in FIGS. 4 and 5 include two or three regions R1, R2, and R3, but the resin member may include N (N is an integer of 4 or more) regions. In this case, the resin fibers in the N regions extend in directions that are different from each other, and the resin member has anisotropic thermal conductivity in which heat can be anisotropically conducted in the N extension direction of the resin fibers in the regions.

EXAMPLES

While the present invention will be described below in more detail with reference to examples, the present invention is not limited to the examples.

A polyethylene terephthalate (PET) pellet was molded into a rod having a diameter of 25 mm, the rod was put into a heating furnace heated to 240° C., and its tip was pulled by a winder, and the rod was stretched at a stretch ratio of 250 to obtain stretch fibers. The diameter of the obtained stretch fiber was 100 μm. The thermal conductivity in the direction in which the stretch fiber extends (stretches) was 150 W/(m·K).

Next, the entire surfaces of the stretch fibers were covered with a heat insulating aerogel (dip coating) to obtain resin fibers, and then collected by a winding drum. The resin fibers were bundled to obtain a resin member having a diameter of 10 cm (anisotropic thermal conductive resin fiber). The radiation intensity ratio of heat in the stretch direction of the stretch fibers before and after they were covered with a thermal insulation material (radiation intensity of heat of the resin fibers: radiation intensity of heat of the stretch fibers) was 1,000:1. Here, the radiation intensity ratio of heat was measured using a Perkin Elmer spectroradiometer according to JIS R1801-2002.

The invention claimed is:

1. An anisotropic thermal conductive resin fiber, comprising:
    a stretch fiber consisting of a thermoplastic resin selected from the group consisting of an acrylic polymer, a methacrylic polymer, polyamide, polyethylene terephthalate, polyarylate, polysulfone, and polyether ether ketone, wherein the stretch fiber has a diameter of 200 µm or less; and a thermal insulation material covering the stretch fiber.

2. The anisotropic thermal conductive resin fiber according to claim 1, wherein the thermal insulation material has a thermal conductivity of 0.1 W/(m·K) or less.

3. The anisotropic thermal conductive resin fiber according to claim 1, wherein the thermal insulation material comprises aerogel or nano bubbles.

4. An anisotropic thermal conductive resin member, comprising:

a plurality of resin fibers which are bundled, wherein the resin fibers include a stretch fiber consisting of a thermoplastic resin selected from the group consisting of an acrylic polymer, a methacrylic polymer, polyamide, polyethylene terephthalate, polyarylate, polysulfone, and polyether ether ketone, and a thermal insulation material covering the stretch fiber, and the stretch fiber has a diameter of 200 µm or less.

5. The resin member according to claim 4, comprising a first region and a second region including the plurality of resin fibers, wherein the plurality of resin fibers in the first region and the plurality of resin fibers in the second region extend in directions that are different from each other.

6. The resin member according to claim 5, wherein the plurality of resin fibers in the first region and the plurality of resin fibers in the second region extend in directions that are substantially orthogonal to each other.

7. The resin member according to claim 4, comprising:

a first region, a second region and a third region including the plurality of resin fibers, wherein the plurality of resin fibers in the first region, the plurality of resin fibers in the second region, and the plurality of resin fibers in the third region extend in directions that are different from each other.

8. The resin member according to claim 7, wherein the plurality of resin fibers in the first region, the plurality of resin fibers in the second region, and the plurality of resin fibers in the third region extend in directions that are substantially orthogonal to each other.

9. The anisotropic thermal conductive resin member according to claim 4, wherein the thermal insulation material has a thermal conductivity of 0.1 W/(m·K) or less.

10. The anisotropic thermal conductive resin member according to claim 4, wherein the thermal insulation material comprises aerogel or nano bubbles.

11. A method of manufacturing an anisotropic thermal conductive resin fiber, comprising:

a step of producing a stretch fiber by stretching a thermoplastic resin, wherein the stretch fiber is consisting of the thermoplastic resin selected from the group consisting of an acrylic polymer, a methacrylic polymer, polyamide, polyethylene terephthalate, polyarylate, polysulfone, and polyether ether ketone, wherein the stretch fiber has a diameter of 200 µm or less; and a step of covering the stretch fiber with a thermal insulation material.

12. A method of manufacturing an anisotropic thermal conductive resin member, comprising:

a step of producing stretch fibers by stretching a thermoplastic resin, wherein the stretch fibers are consisting of the thermoplastic resin selected from the group consisting of an acrylic polymer, a methacrylic polymer, polyamide, polyethylene terephthalate, polyarylate, polysulfone, and polyether ether ketone, wherein the stretch fiber has a diameter of 200 µm or less;

a step of producing resin fibers by covering the stretch fibers with a thermal insulation material; and a step of bundling the plurality of resin fibers.

\* \* \* \* \*